(12) United States Patent
Yu et al.

(10) Patent No.: US 7,108,536 B2
(45) Date of Patent: Sep. 19, 2006

(54) SOCKET CONNECTOR HAVING STRUCTURE FOR PREVENTING SIDEWAYS MOVEMENT

(75) Inventors: Wei Yu, Kunsan (CN); Fujin Peng, Kunsan (CN); Wen He, Kunsan (CN)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 11/024,896

(22) Filed: Dec. 28, 2004

(65) Prior Publication Data

US 2005/0215102 A1 Sep. 29, 2005

(30) Foreign Application Priority Data

Mar. 26, 2004 (TW) ............................... 93108270 A

(51) Int. Cl.
*H01R 4/50* (2006.01)
(52) U.S. Cl. .................................................... 439/342
(58) Field of Classification Search ................ 439/342, 439/70, 259–270, 525
See application file for complete search history.

(56) References Cited

U.S. PATENT DOCUMENTS

| | | | |
|---|---|---|---|
| 6,254,415 B1 | 7/2001 | Mizumura et al. | |
| 6,338,640 B1* | 1/2002 | Lin | 439/342 |
| 6,431,900 B1 | 8/2002 | Yu | |
| 6,508,658 B1* | 1/2003 | Szu et al. | 439/342 |
| 6,579,112 B1 | 6/2003 | Nobuyuki et al. | |
| 6,746,263 B1* | 6/2004 | Luo | 439/342 |
| 6,780,040 B1* | 8/2004 | Tan | 439/342 |
| 6,814,604 B1* | 11/2004 | Lee | 439/342 |
| 6,881,087 B1* | 4/2005 | Norris et al. | 439/342 |

* cited by examiner

*Primary Examiner*—Truc T. Nguyen
*Assistant Examiner*—Edwin A. Leon
(74) *Attorney, Agent, or Firm*—Wei Te Chung

(57) ABSTRACT

A socket connector (5) includes a base (6), a cover (7) slidably assembled onto the base and capable being moved with respect to the base along a first direction, an actuator (8) for actuating the cover to slide on the base between a contact insert position and a second engagement position, and guiding and latching arrangement (621) arranged between the base and the cover and adjacent to the actuator so as to balance a movement of the cover along a second direction substantially traverse to the first direction.

4 Claims, 6 Drawing Sheets

SOCKET CONNECTOR HAVING STRUCTURE FOR PREVENTING SIDEWAYS MOVEMENT

BACKGROUND OF THE INVENTION

1. Field of the invention

The present invention relates to an electrical connector, and more particularly to a ZIF (Zero Insertion Force) socket connector for connecting a central processing unit (CPU) of a computer system to a printed circuit board (PCB).

2. Description of Related Art

ZIF sockets are known in the art for connecting Integrated Circuit (IC) packages to printed circuit boards. U.S. Pat. Nos. 6,338,640, 6,431,900, 6,579,112, 6,254,415 disclose some ZIF socket connectors. Referring to FIG. 6, one example of such conventional connectors comprises a base 2, a cover 3, and an actuator 41. The cover 3 is movably mounted on an upper surface of the base 2. The actuator 41 is in form of a cam comprising at least two cylindrical portions, central axes of which are offset from each other. One of the cylindrical portions interferes with the base 2 and another interferes with the cover 3. When the actuator 41 is rotated, the cam axe moves to push or pull the cover 3 to slide with respect to the base 2, along an anticipative front-to-back direction, that is between a contact insert position and a contact engagement position. When the actuator 41 is rotated to drive the cover 3 to slide along the front-to-back direction, an inevitable force along a left-to-right direction may exert on the cover 3, which causes a sideways movement of the cover 3 with respect to the base 2. When this happens, the cover 3 may slide improperly or even fail to slide.

To overcome above-motioned problems, an improved socket connector is desired.

SUMMARY OF THE INVENTION

An object of the present invention, therefore, is to provide a socket connector with anti-rotation design for preventing a cover thereof from sideways moving with respect to a base thereof.

Accordingly, to achieve the above object, a socket connector for connecting a central processing unit (CPU) to a printed circuit board of the present invention comprises a base arranged in a first plane defined by a lengthwise and a lateral direction and defining a plurality of passageways receiving a plurality of terminals extending from the printed circuit board, a cover arranged in a second plane and slidably mounted on the base, and defining a plurality of channels in a one-to-one corresponding relationship with the passageways of the base for receiving a plurality of contacts of the CPU, block means formed on one of the base and the cover and protruding out of the corresponding one of the first and the second planes for preventing the cover from sideways moving in said lateral direction, a receiving hole defined in the other one of the base and the cover for receiving the block means with a certain movement space remained for the block means sliding in said lengthwise direction, and an actuator for driving the cover to slide on the base between a contact insert position and a second engagement position.

Other objects, advantages and novel features of the present invention will become more apparent from the following detailed description of the present embodiment when taken in conjunction with the accompanying drawings.

DETAILED DESCRIPTION OF THE INVENTION

Figure 1:
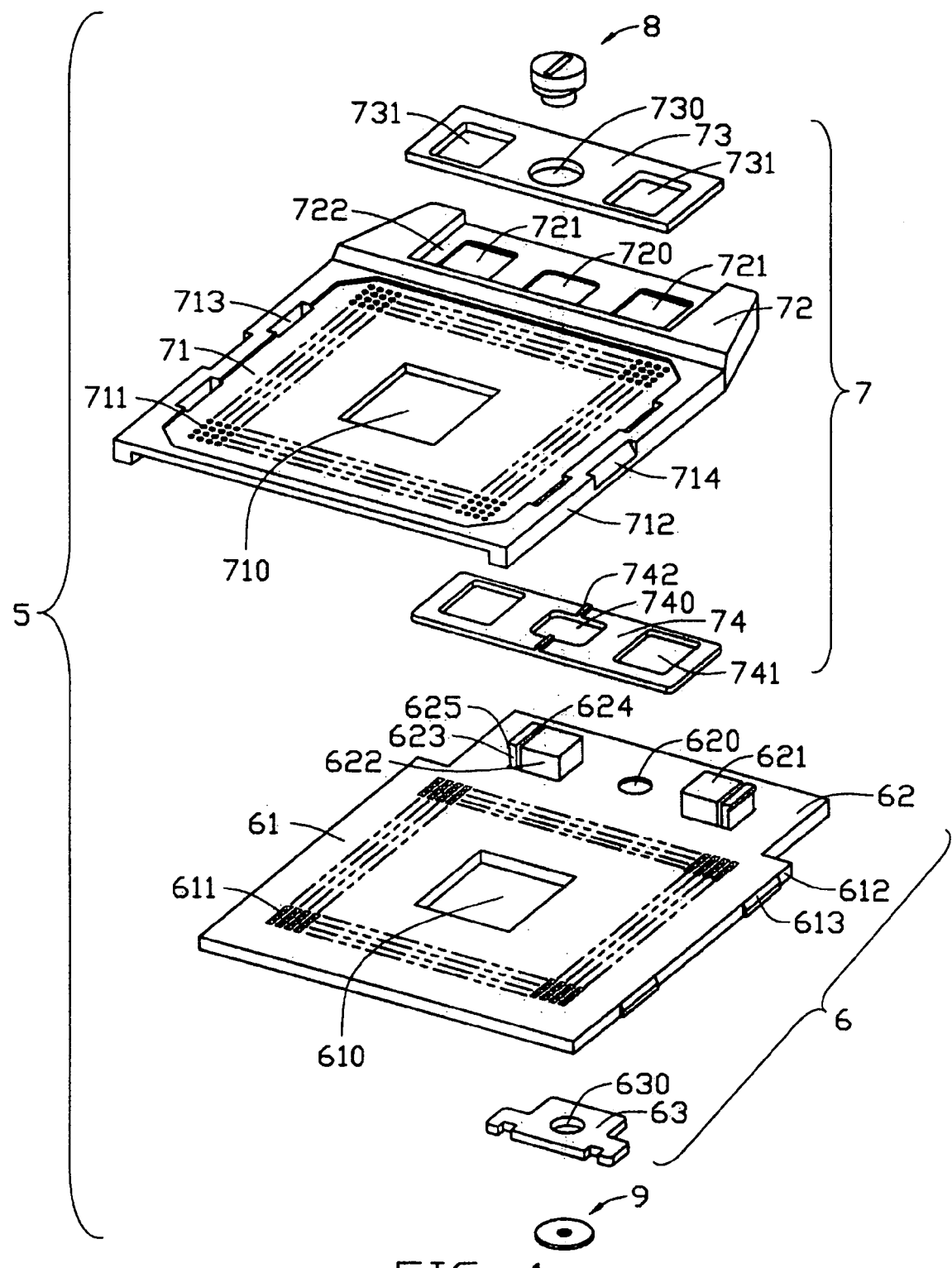
FIG. 1 is a simplified exploded view from a top aspect of view of a socket connector in accordance with a first embodiment of the present invention.
Figure 2:
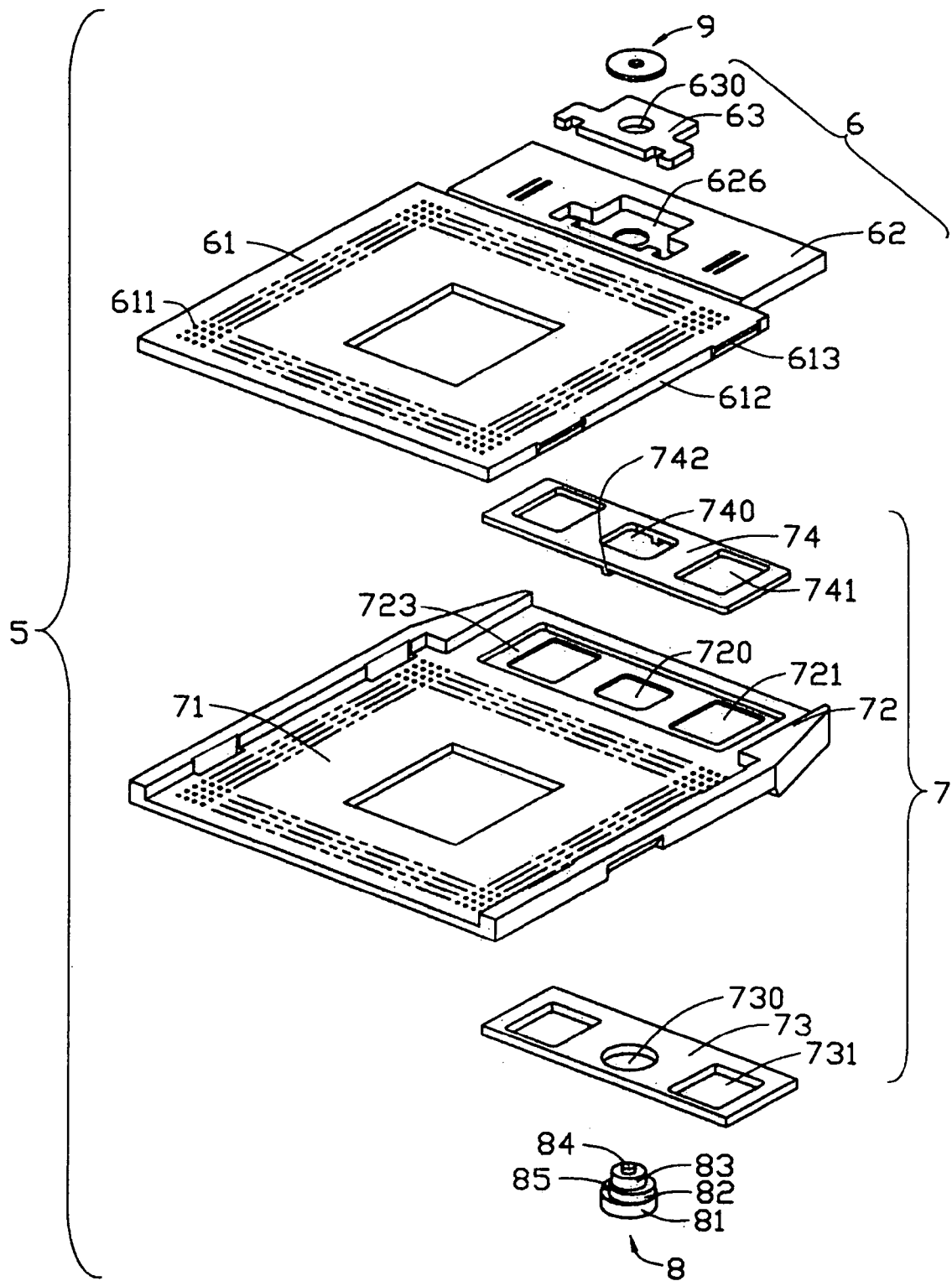
FIG. 2 is a simplified exploded view from a bottom aspect of view of the socket connector in accordance with the first embodiment of the present invention.
Figure 3:
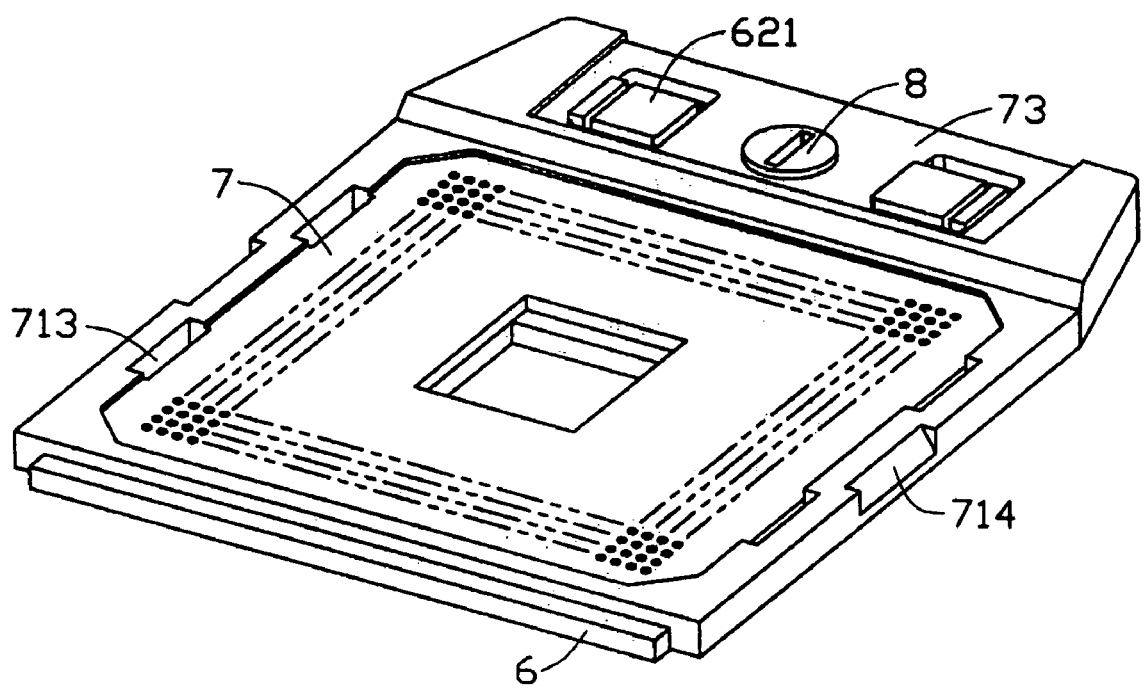
FIG. 3 is an assembled perspective view of the socket connector of FIG. 1 in an initial contact insert position.
Figure 4:
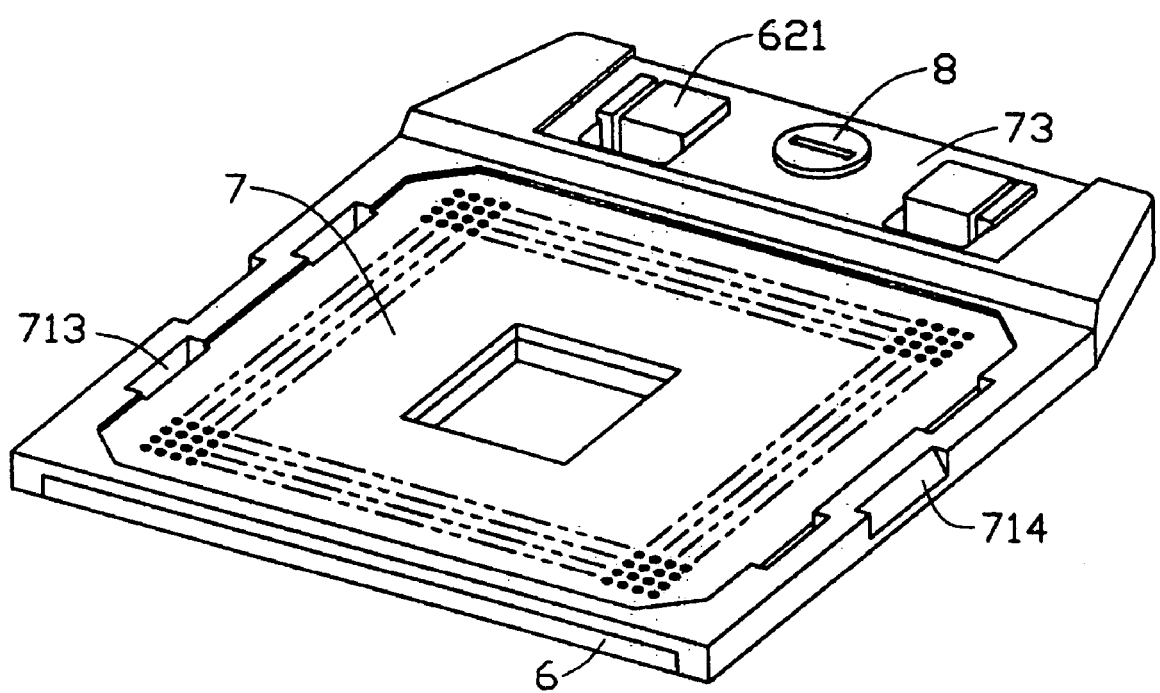
FIG. 4 is an assembled perspective view of the socket connector of FIG. 1 in a final contact engagement position.

Reference will now be made to the drawing figures to describe the present invention in detail.

Referring to FIGS. 1–5, a socket connector 5 in accordance with a first embodiment of the present invention is used for connecting a chip module (not shown) to a printed circuit board (not shown) and comprises a base 6, a cover 7 slidably engaged on the base 6 in a front-to-rear direction, a plurality of contacts (not shown) received in the base 6, an actuator 8 in form of a cam and a washer 9 for fixing the actuator 8.

The base 6 comprises an insulative mainbody 61 in the shape of a square, an insulative front portion 62 in front of the mainbody 61 and a T-shaped metallic base plate 63. The mainbody 61 defines a first central opening 610 in a middle region thereof and a plurality of passageways 611 in the periphery of the central opening 610 and extending vertically through the mainbody 61. Each passageway 611 receives a terminal (not shown) therein. A pair of protrusions 613 extend from each side edge 612 of the mainbody 61. The front portion 62 comprises an upper surface (not labeled) for mating with the cover 7 and a bottom surface (not labeled) for mating with the printed circuit board. The bottom surface defines a T-shaped recess 626 for receiving the base plate 63 and a base through hole 620 for engaging with actuator 8. A pair of blocks 621 upwardly protrude from the upper surface of the front portion 62 and are respectively arranged on opposite lateral sides of the base through hole 620. Each block 621 comprises a guiding member 622 and a latch member 623 arranged adjacent to an outer face of the guiding member 622. The pair of guiding members 622 have opposite inner faces for preventing a sideways movement along the lateral direction between the cover 7 and the base 6 by abutting against the cover 7. A groove 624 is defined between each guiding member 622 and a corresponding latch member 623 in order to enable the latch member 623 to resiliently move with respect to the guiding member 622. Each latch member 623 forms a fastening end 625 in form of a hook on a top thereof for securely engaging with the cover 7. The base plate 63 defines a plate through hole 630 corresponding to the base through hole 620.

The cover 7 comprises an insulative body portion 71 in the shape of a square, an insulative header portion 72 in front of the body portion 71, a metallic top cover plate 73 and a metallic bottom cover plate 74. The body portion 71 defines a second central opening 710 and a plurality of channels 711 provided in a one-to-one corresponding relationship with the passageways 611 of the underlying base 2, and comprises a pair of lateral flanges 712 depending down vertically on two sides thereof. Each flange 712 defines a pair of fixing slots 713 in an inner wall thereof for receiving corresponding protrusions 613, respectively, each leaving a small distance for the protrusions 613 to slide therein along a lengthwise direction, and a recess 714 for facilely operating the chip module. The header portion 72 has a top and a bottom faces 722, 723 and defines a rectangular cover through hole 720 and a pair of rectangular receiving holes 721 at opposite sides of the cover through hole 720 for receiving the pair of blocks 621, respectively. The cover through hole 720 and the receiving holes 721 are substantially in a line. The top cover plate 73 defines a first central hole 730 corresponding to the base through hole 620 for engaging with the actuator 8, and a pair of first side holes 731. The bottom cover plate 74 defines a second central hole 740 and a pair of second side holes 741. The first central hole 730 is corresponding to the cover through hole 720 and the second central hole 740. The first side holes 731 are corresponding to the receiving holes 721 and the second side holes 741. Lateral dimensions of the first side hole 731, the receiving hole 721 and the second side hole 741 are equal to that of each block 621, thereby providing a fitable engagement therebetween in the lateral direction in order to prevent the cover 7 lateral moving with respect to the base 6. Longitudinal dimensions of the first side hole 731, the receiving hole 721 and the second side hole 741 are a little larger than that of each block 621, which is to provide a movement space for the block 621 in the lengthwise direction. A pair of stoppers 742 are formed on opposite sides of the second central hole 740 of the bottom cover plate 74 to stop the actuator 8.

The actuator 8 successively comprises a first, a second, a third and a fourth cylindrical posts 81, 82, 83 and 84 formed one on the other. The cylindrical posts progressively decrease in diameter from top to bottom. The first post 81, the second post 82 and the third post 83 are respectively received in the first central hole 730, the cover through hole 720 and the second central hole 740, and the base through hole 620 and the plate hole 630. The fourth post 84 is for fitting with the washer 9. A diameter of the first post 81 is equal to that of the first central hole 730 and a diameter of the third post 83 is equal to that of the base through hole 620. The second post 82 has a diameter equal to lateral lengths of the cover through hole 720 and the receiving hole 740 but shorter than longitudinal lengths thereof, which remains a movement space in the lateral direction to the second post 82 but restrains the movement in the lengthwise direction in the cover through hole 720 and the second central hole 740. The second cylindrical portion 82 forms a bulge 85 from a circumferential periphery thereof. Central axes of the first, the third and the fourth cylindrical portions 81, 83 and 84 are in-line, but the second cylindrical portion 82 is offset, which forms a eccentricity design.

In assembly, the top cover plate 73, the bottom cover plate 74 and the base plate 63 are respectively insert-molded or mechanical pressed onto the top face 722 and the bottom face 723 of the header portion 72 of the cover 7 and the T-shaped recess 626 of the base 6. The top cover plate 73 is assembled to prevent the cover 7 from engaging directly with the actuator 8, which may result in abrasion of the cover 7. The cover 7 is mounted onto the base 6 with the protrusions 613 of the base 6 engaging with the fixing slots 713 of the cover 7, the lateral flanges 712 of the body portion 71 respectively fastening two opposite sides of the base 6, and the pair of blocks 621 respectively received in the corresponding first side hole 731, second side hole 741 and receiving hole 721. The fastening ends 625 of the blocks 621 hook outer edges of the first side holes 731 of the top cover plate 73 whereby the blocks 621 are fixed.

The actuator 8 is sequentially extended through the first central hole 730, the cover through hole 720, the second central hole 740, the base through hole 620 and the plate through hole 630, and then is riveted with the washer 9 to be secured in the socket connector 5. The bulge 85 on the actuator 8 is extended into a space between the header portion 72 and the bottom cover plate 74 and can rotate in said space and be restricted by the stoppers 742. Widths of the blocks 621 being smaller than those of the first and second holes 731, 741 and the receiving holes 721, and the eccentricity design of the actuator 8 corporately make the actuator 8 drive the cover 7 to slide on the base 6 in the lengthwise direction between a first contact insert position at which contacts of the CPU are inserted into the channels 711 of the cover 7 and the passageways 611 of the base with Zero Insertion Force and a second engagement position at which then contacts of the CPU in the passageways 611 engage the terminals in the passageways 611 of base 6.

According to the above-mentioned configuration, when the actuator 8 drives the cover 7 to slide on the base 6 between the contact insert position and the contact engagement position, the guiding members 622 of the base 6 and the flanges 712 of the cover 7 corporately restrict sideways movement of the cover 7 with respect to the base 6, wherein the guiding members 622 are stronger, more tightened and more effective to resist against said sideways movement. Thereby, with such a design, the possible sideways rotation movement of the cover 7 is avoided or at least minimized, that ensures proper and efficient connection between the contacts and the terminals.

In this preferred embodiment, the bottom cover plate 74 can be limited. Without the bottom cover plate 74, the stoppers 742 can be formed at a suitable position on the top cover plate 73 to restrict the rotation of the actuator 8. Accompanyingly, the bulge 85 is formed on the first cylindrical post 81 instead of the second cylindrical post 82.

Figure 5:
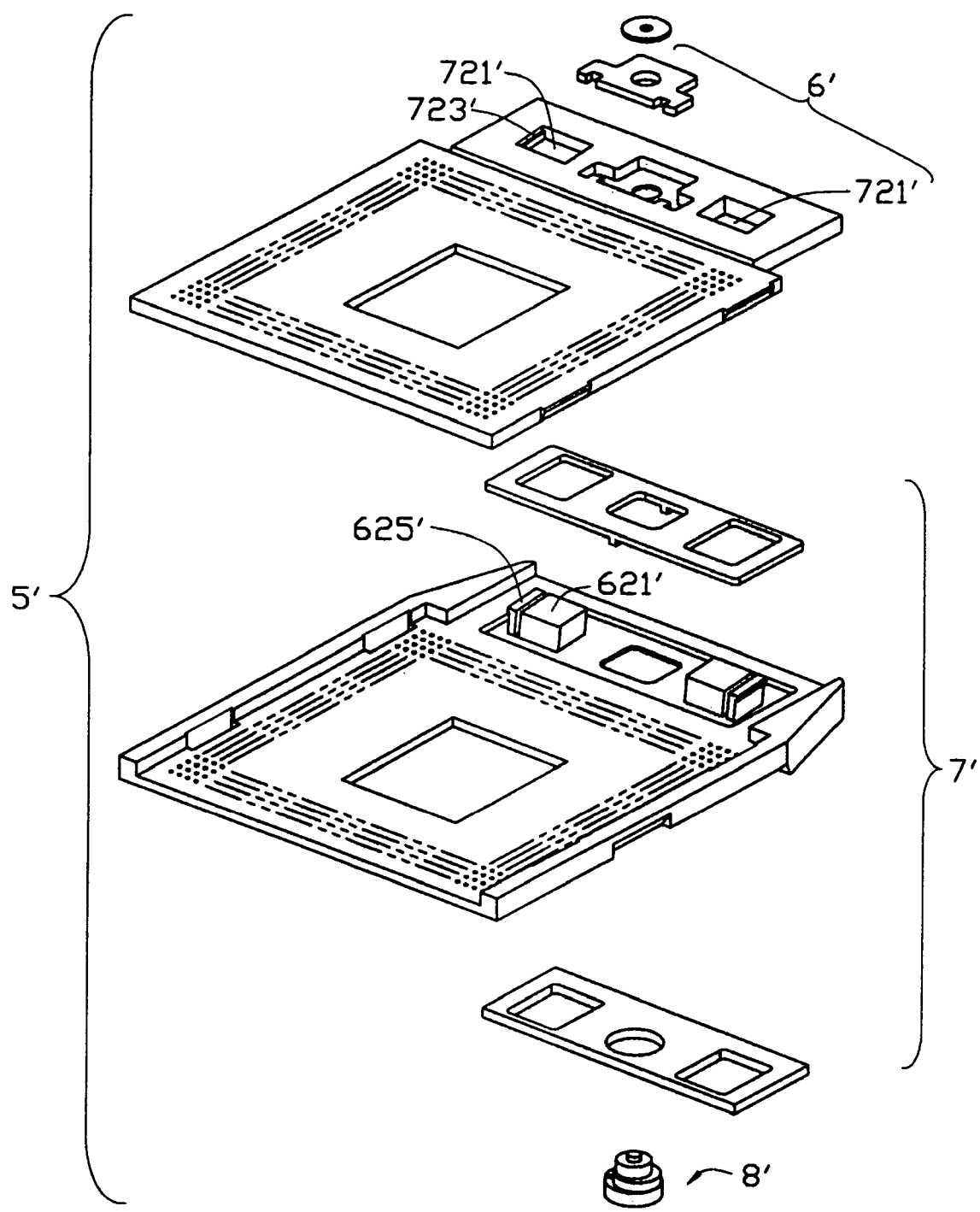
FIG. 5 is a simplified exploded view from a bottom aspect of view of the socket connector in accordance with a second embodiment of the present invention.
Figure 6:
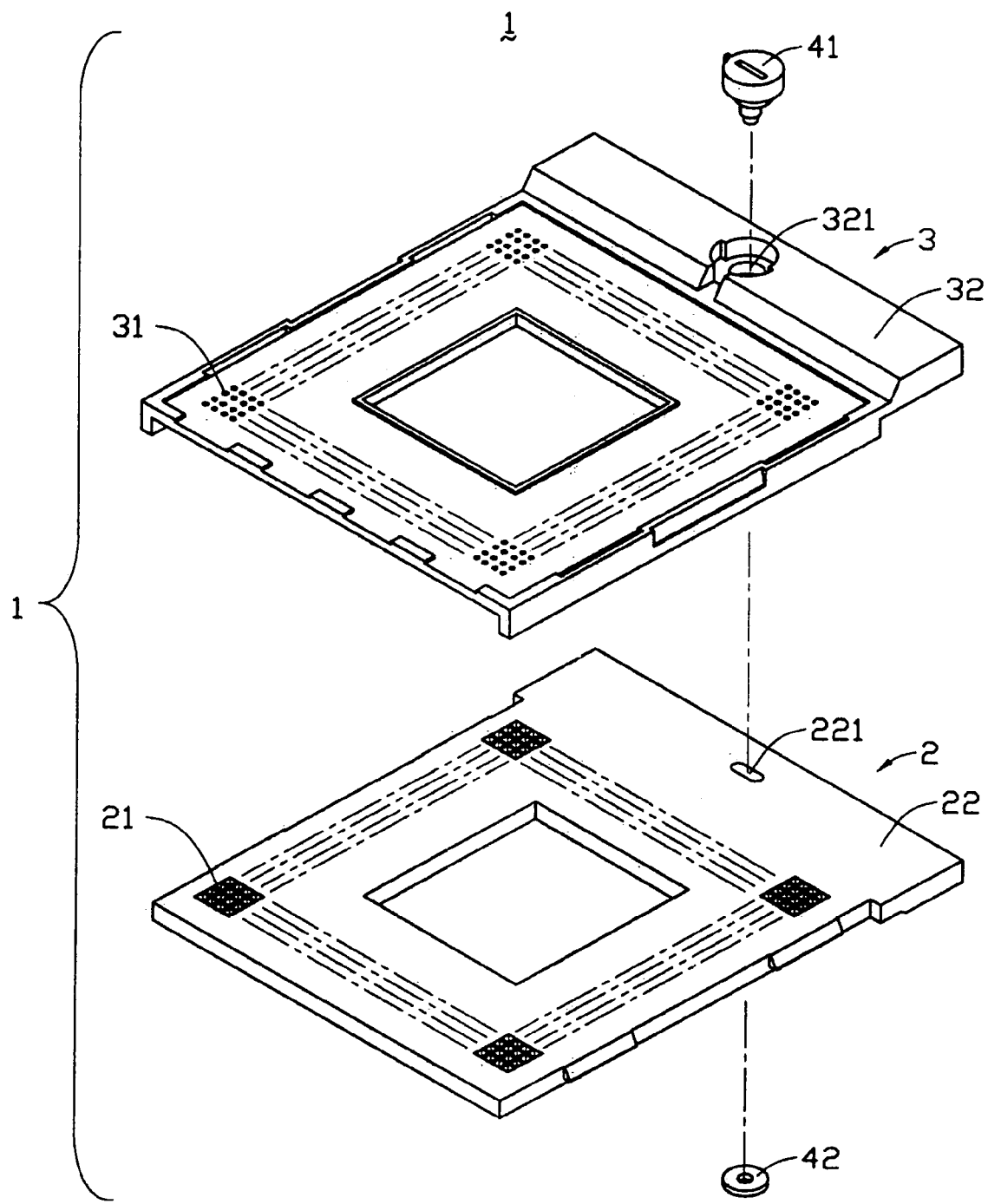
FIG. 6 is an exploded view of a conventional socket connector.

Referring to FIG. 5, a socket connector 5' in accordance with a second embodiment of the present invention comprises a base 6', a cover 7' and an actuator 8'. The cover 7' comprises a pair of blocks 621 ' extending from a bottom face thereof which has the same configuration as the one designated 621 in FIG. 1. The base 6' defines a pair of receiving holes 721'. A step member 723' inwardly extends from an outer edge of each receiving hole 721' for engaging with a corresponding fastening end 625' of the block 621'. Concrete structure and assembly process of the socket connector 5' can refer to the first embodiment.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A socket connector for receiving a component having a plurality of contacts, the socket connector comprising;
   a base arranged in a first plane defined by a lengthwise and a lateral direction and defining a plurality of passageways for receiving a plurality of terminals therein;

a cover arranged in a first plane and slidably mounted on the base, the cover defining a plurality of channels provided in a one-to-one corresponding relationship with the passageways of the base for receiving the contacts;

block means formed on one of the base and the cover and protruding out of the corresponding one of the first and the second planes for preventing the cover from sideways moving in said lateral direction;

a receiving hole defined in the other one of the base and the cover for receiving the block means with a certain movement space remained for the block means sliding in said lengthwise direction; and a cam-like actuator having a plurality of cylindrical portions joined in a vertical direction, one of the cylindrical portions being arranged in an axis-offset relationship with the other cylindrical portions, the cam-like actuator for driving the cover to slide on the base between a contact insert position and a second engagement position in said lengthwise direction; wherein the base comprises a mainbody and a front portion in front of the body portion, and the cover comprises a body portion and a header portion in front of the body portion; wherein the cover comprises a cover plate made of metal and formed onto the cover, the cover plate defining a central hole for receiving a corresponding portion of the actuator and a pair of side holes therein for receiving the block means.

2. The socket connector as claimed in claim 1, wherein the cover plate further comprises a top and a bottom cover plates respectively mounted onto a top and a bottom faces of the header portion.

3. The socket connector as claimed in claim 2, wherein the base comprises a T-shaped base plate made of metal and received in a T-shaped recess defined in the front portion.

4. The socket connector as claimed in claim 2, wherein the actuator is formed of a cam and mounted through the header portion of the cover and the front portion of the base, the actuator having a bulge outwardly protruding therefrom, the bottom cover plate having a pair of stoppers for stopping the bulge thereby restricting a rotation of the actuator.

* * * * *